(12) United States Patent
Fillion et al.

(10) Patent No.: US 8,259,454 B2
(45) Date of Patent: Sep. 4, 2012

(54) INTERCONNECT STRUCTURE INCLUDING HYBRID FRAME PANEL

(75) Inventors: Raymond Albert Fillion, Niskayuna, NY (US); Donald Stephen Bitting, Sinking Spring, PA (US); Daniel Lee Abraham, Northport, NY (US)

(73) Assignee: General Electric Company, Schenectady, NY (US)

( * ) Notice: Subject to any disclaimer, the term of this patent is extended or adjusted under 35 U.S.C. 154(b) by 636 days.

(21) Appl. No.: 12/102,429

(22) Filed: Apr. 14, 2008

(65) Prior Publication Data

US 2009/0255709 A1 Oct. 15, 2009

(51) Int. Cl.
*H05K 7/00* (2006.01)
*H05K 1/03* (2006.01)
*H01L 23/04* (2006.01)

(52) U.S. Cl. ......... 361/746; 257/698; 257/778; 174/255
(58) Field of Classification Search .................. 361/746; 257/698, 778

See application file for complete search history.

(56) References Cited

U.S. PATENT DOCUMENTS

| | | | |
|---|---|---|---|
| 3,436,819 A * | 4/1969 | Lunine | 29/830 |
| 4,246,595 A | 1/1981 | Noyori et al. | |
| 4,566,186 A * | 1/1986 | Bauer et al. | 29/852 |
| 4,722,914 A | 2/1988 | Drye et al. | |
| 5,869,894 A * | 2/1999 | Degani et al. | 257/723 |
| 6,324,067 B1 * | 11/2001 | Nishiyama | 361/761 |
| 6,449,168 B1 * | 9/2002 | Soderholm | 361/761 |
| 6,586,822 B1 * | 7/2003 | Vu et al. | 257/678 |
| 6,734,534 B1 | 5/2004 | Vu et al. | |
| 6,825,063 B2 | 11/2004 | Vu et al. | |
| 6,838,776 B2 | 1/2005 | Leal et al. | |
| 6,894,399 B2 | 5/2005 | Vu et al. | |
| 6,974,724 B2 | 12/2005 | Hyvönen et al. | |
| 6,991,966 B2 | 1/2006 | Tuominen | |
| 7,183,658 B2 | 2/2007 | Towle et al. | |
| 7,400,035 B2 * | 7/2008 | Abe et al. | 257/700 |

(Continued)

FOREIGN PATENT DOCUMENTS

WO WO2005027602 A1 3/2005

(Continued)

OTHER PUBLICATIONS

Towle et al., "Bumpless Build-Up Layer Packaging", Intel Corporation Components Research, ASME Paper, 7 pages, Nov. 2001.

*Primary Examiner* — Xiaoliang Cheng
*Assistant Examiner* — Nathan Milakovich
(74) *Attorney, Agent, or Firm* — Ziolkowski Patent Solutions Group, SC; Jean K. Testa

(57) ABSTRACT

An electronic component includes a base insulative layer having a first surface and a second surface; at least one electronic device having a first surface and a second surface, wherein the electronic device is secured to the base insulative layer; at least one I/O contact located on the first surface of the electronic device; and a frame panel defining an aperture, wherein the electronic device is disposed within the aperture, and the frame panel is a multi-functional structure having a first region comprising a first material, wherein a surface of the first region secures to the base insulative layer; and a second region comprising a second material, wherein the first material and the second material differ from each other and have differing adhesability to the base insulative layer.

24 Claims, 3 Drawing Sheets

U.S. PATENT DOCUMENTS

| | | | |
|---|---|---|---|
| 7,582,961 B2* | 9/2009 | Chia et al. | 257/698 |
| 7,598,610 B2* | 10/2009 | Hsu et al. | 257/703 |
| 7,768,119 B2* | 8/2010 | Chia | 257/698 |
| 7,830,004 B2* | 11/2010 | Wu | 257/729 |
| 2003/0030140 A1* | 2/2003 | Shim | 257/712 |
| 2005/0056942 A1* | 3/2005 | Pogge et al. | 257/778 |
| 2005/0117312 A1* | 6/2005 | Kimura et al. | 361/746 |
| 2005/0189644 A1* | 9/2005 | Ho et al. | 257/700 |
| 2005/0224988 A1 | 10/2005 | Tuominen | |
| 2005/0253244 A1* | 11/2005 | Chang | 257/692 |
| 2006/0043568 A1* | 3/2006 | Abe et al. | 257/698 |
| 2006/0186531 A1* | 8/2006 | Hsu | 257/700 |
| 2006/0237854 A1* | 10/2006 | Hsu | 257/778 |
| 2008/0023819 A1* | 1/2008 | Chia et al. | 257/692 |
| 2008/0116562 A1* | 5/2008 | Lien et al. | 257/690 |
| 2008/0116569 A1* | 5/2008 | Huang et al. | 257/712 |
| 2008/0179725 A1* | 7/2008 | Chia et al. | 257/676 |
| 2008/0305582 A1* | 12/2008 | Fillion et al. | 438/118 |
| 2008/0318413 A1* | 12/2008 | Fillion et al. | 438/637 |
| 2009/0028491 A1* | 1/2009 | Fillion et al. | 385/14 |

FOREIGN PATENT DOCUMENTS

| | | |
|---|---|---|
| WO | WO2006013230 A2 | 2/2006 |

* cited by examiner

INTERCONNECT STRUCTURE INCLUDING HYBRID FRAME PANEL

TECHNICAL FIELD

The invention includes embodiments that relate to an interconnect structure. More particularly, the invention embodiments relate to an interconnect structure including a frame panel.

DISCUSSION OF ART

Bonding of electronic devices such as semiconductor chips, discrete passives, BGA carriers or other electrical elements onto printed circuit boards, substrates, interconnect structures or flex circuits is generally done with solders or adhesives. In an area array solder attach assembly, the electrical connections are made by raising the temperature to reflow the solder, which solidifies upon cooling. In applications where the coefficient of thermal expansion (CTE) of the electronic device is not a close match for the CTE of the substrate upon which it is attached, thermal cycling will stress the solder joints and may cause solder fatigue failure. One method to overcome this issue is to encase the solder joints with a polymer resin underfill such as a filled epoxy to stress relieve the solder joints. These underfills can be applied by dispensing liquid resin on one or more sides of a component and allowing the resin to flow under the component by capillary action.

In a current embedded chip process, referred to as Embedded Chip Build-Up (ECBU) or Chips First Build-Up (CFBU) technology, bare chips are packaged with perimeter or peripheral I/O pads or with an array of I/O pads distributed over the top surface into a high density interconnect structure without the need for either solder joints or wirebonds. The ECBU or CFBU process can be used to form a chip carrier that interconnects a complex semiconductor chip to larger contact pads that are compatible with board level assemblies such as printed circuit boards. The interconnect structure may include a base insulative layer. The base insulative layer may support optional layers of metallization on the surface of the insulative layer. If a support structure provides rigidity to the base insulative layer, the support structure should withstand reliability testing of the interconnect structure, such as stress, temperature and humidity based testing.

It may be desirable to have an electronic device with one or more properties or characteristics that differ from those currently available.

BRIEF DESCRIPTION

In one embodiment, the invention provides an electronic component. The electronic component includes a base insulative layer having a first surface and a second surface; at least one electronic device having a first surface and a second surface, wherein the electronic device is secured to the base insulative layer; at least one I/O contact located on the first surface of the electronic device; and a frame panel defining an aperture, wherein the electronic device is disposed within the aperture, and the frame panel is a multi-functional structure having a first region comprising a first material, wherein a surface of the first region secures to the base insulative layer; and a second region comprising a second material, wherein the first material and the second material differ from each other and have differing adhesability to the base insulative layer.

In one embodiment, an electronic component includes a base insulative layer having a first surface and a second surface; an electronic device having a first surface and a second surface, and the electronic device is secured to the base insulative layer; a first I/O contact located on the first surface of the electronic device; and a frame panel defining an aperture, wherein the electronic device is disposed within the aperture, and the frame panel is a multi-functional structure having a first region secured to the base insulative layer, wherein the first region is defined by a relatively high affinity or adhesability to the base insulative layer; and a second region that has a relatively lower high affinity or adhesability to the base insulative layer, but a relatively higher dimensional stability, or resistance to stress, temperature or humidity, than the first region.

DETAILED DESCRIPTION

The invention includes embodiments that relate to an interconnect structure. More particularly, the invention embodiments relate to an interconnect structure including a frame panel.

Figure 1:
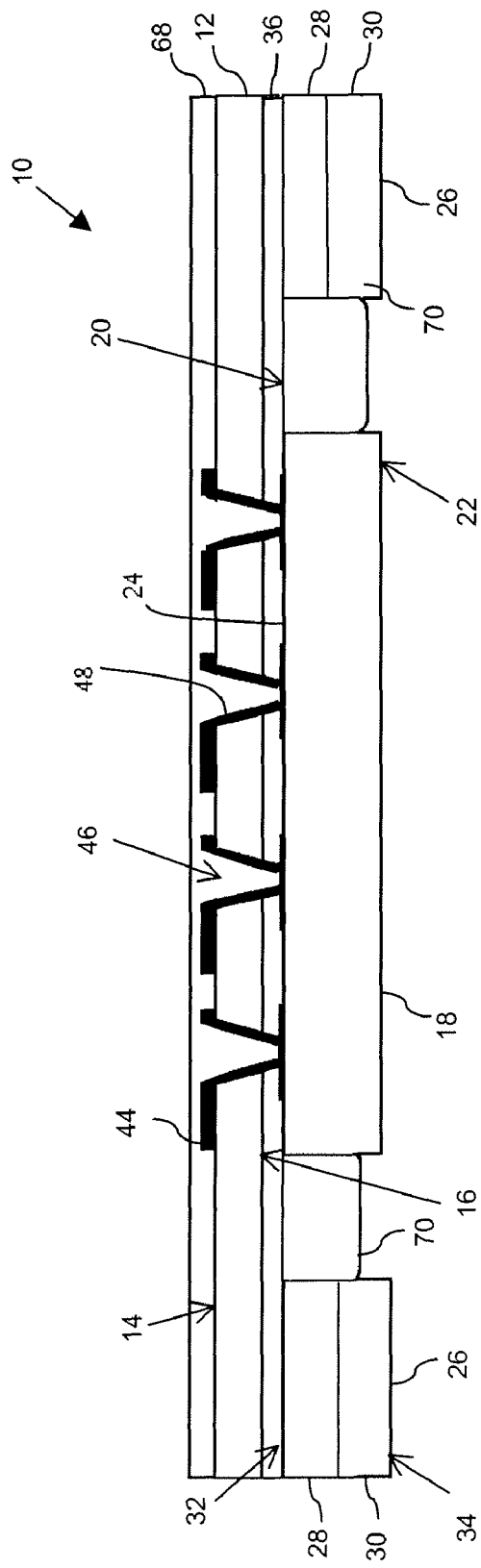
FIG. 1 is a cross-sectional side view of an interconnect structure made in accordance with an embodiment of the invention.

Referring to FIG. 1, shown is an electronic component 10 including a base insulative layer 12 having a first surface 14 and a second surface 16. An electronic device 18 secures to the base insulative layer. The electronic device has a first surface 20 and a second surface 22. At least one I/O contact 24 is located on the first surface of the electronic device. A frame panel 26 includes a first region 28 comprised of a first material and a second region 30 comprised of a second material. The first material and the second material differ from each other. A surface of the frame panel first region is secured to the base insulative layer. The frame panel also includes at least one aperture, wherein the electronic device is disposed within the aperture.

The base insulative layer is formed from an electrically insulating material. In addition, the base insulative layer may be a polymer film to which an electrically conductive material can be secured. Suitable material for use as the base insulative layer may include one or more of polyimide, polyetherimide, benzocyclobutene (BCB), liquid crystal polymer, bismaleimide-triazine resin (BT resin), epoxy, or silicone. Suitable commercially available materials for use as the base insulative layer may include KAPTON® H polyimide or KAPTON® E polyimide (manufactured by E. I. du Pont de Nemours & Co.), APICAL® AV polyimide (manufactured by Kanegafugi Chemical Industry Company), UPILEX® polyimide (manufactured by UBE Industries, Ltd.), and ULTEM® polyetherimide (manufactured by General Electric Company). In the illustrated embodiment, the base insulative layer is fully cured as KAPTON® H polyimide.

The base insulative layer may be formed into an interconnect structure, flex circuit, circuit board, or other structure. The interconnect structure can mount and interconnect with one or more electronic devices. With regard to one embodiment, selection properties for the base insulative layer include an elastic modulus and coefficients of thermal and humidity expansion that provide minimal dimensional change during processing. To maintain flexibility, the thickness of the base insulative layer may be minimized. The base insulative layer must have enough rigidity (due to either thickness, a support structure, or material characteristic) to support layers of metallization optionally on both the first and second surfaces of the base insulative layer.

With regard to the thickness of the base insulative layer, suitable thickness may be selected with reference to the end-use application, the number and type of electronic devices, and the like. The thickness may be greater than about 10 micrometers. The thickness may be less than about 50 micrometers. In one embodiment, the base insulative layer has a thickness in a range of from about 10 micrometers to about 20 micrometers, from about 20 micrometers to about 30 micrometers, from about 30 micrometers to about 40 micrometers, from about 40 micrometers to about 50 micrometers, or greater than about 50 micrometers. With regard to one embodiment where the base insulative layer is a circuit board, its suitable thickness may be based on the number of layers within the circuit board. The number of circuit board layers generally ranges from about 2 to about 50 or more with each layer having a thickness of about 100 micrometers.

As shown in FIG. 1, the first surface of the electronic device may be the active surface of the device upon which one or more I/O contacts are located. Examples of I/O contacts, which may be located on the electronic device, include pads, pins, bumps, and solder balls. In the illustrated embodiment, the I/O contacts are I/O pads. Other suitable electronic devices may be a packaged or unpackaged semiconductor chip such as a microprocessor, a microcontroller, a video processor, or an ASIC (Application Specific Integrated Circuit); a discrete passive; or a ball grid array (BGA) carrier. In one embodiment, the electronic device is a semiconductor silicon chip with an array of I/O contact pads disposed on its first surface.

In one embodiment, the frame panel has a first surface 32 and a second surface 34. The first surface of the electronic device and the first surface of the frame panel secure to the second surface of the base insulative layer. The base insulative layer may bond to the frame panel and electronic device using an adhesive layer 36. The adhesive layer comprises a thermoset adhesive. Examples of suitable adhesives may include a thermoset polymer. Suitable thermoset polymers may include an epoxy, silicone, acrylate, urethane, polyetherimide, or polyimide. Suitable commercially available thermoset adhesives may include a polyimide such as CIBA GEIGY 412 (manufactured by Ciba Geigy), AMOCO AI-10 (manufactured by Amoco Chemicals Corporation) and PYRE-MI (manufactured by E. I. du Pont de Nemours & Co.). CIBA GEIGY 412 has a glass transition temperature of about 360 degrees Celsius. Other suitable adhesives may include thermoplastic adhesives, water cure adhesives, air cure adhesives, and radiation cure adhesives.

The adhesive layer may have a thickness greater than about 5 micrometers. In one embodiment, the adhesive layer has a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers.

Figure 2:
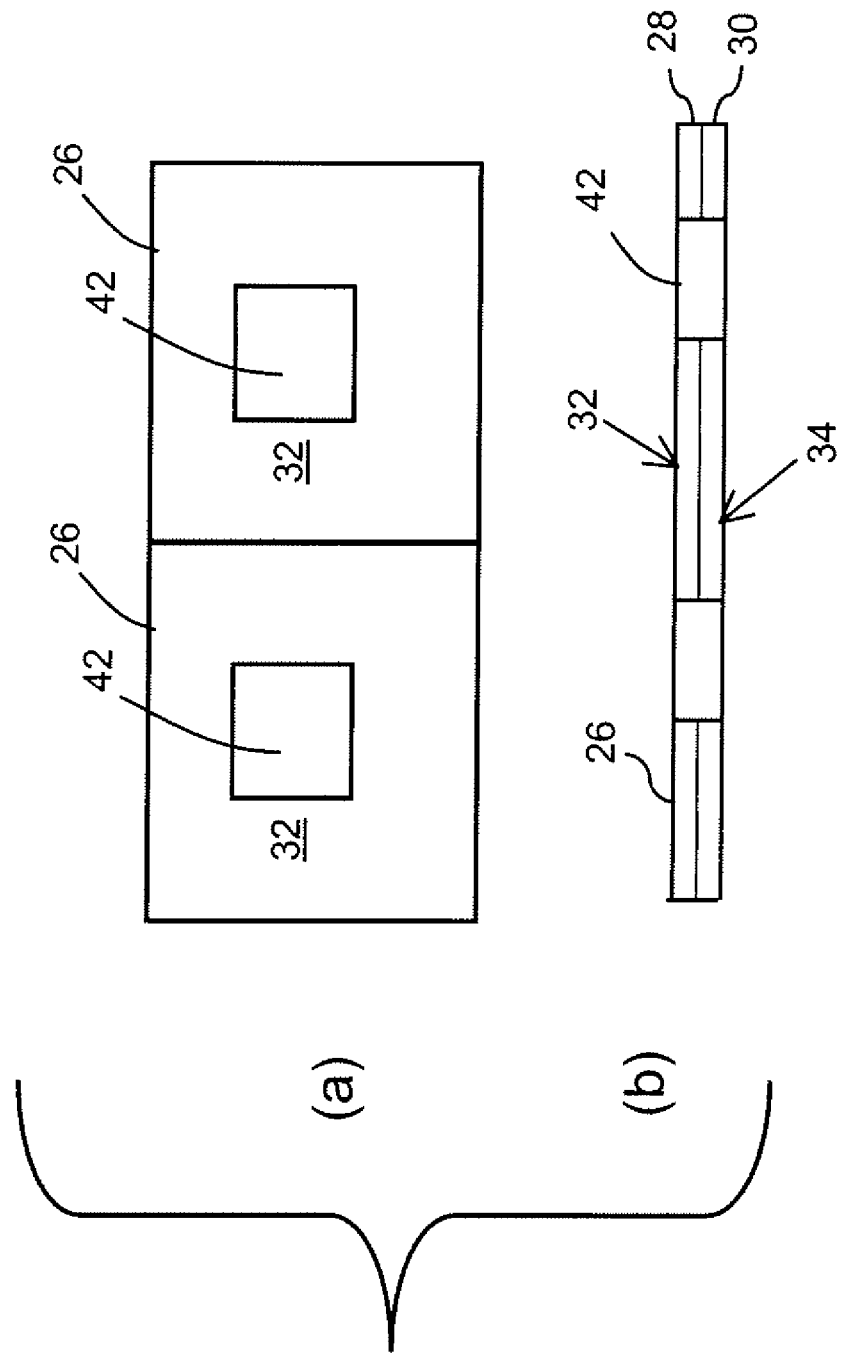
FIG. 2(a) is a top view of a frame panel.
FIG. 2(b) is a cross-sectional side view of a frame panel.

Referring to FIGS. 2a and 2b, the frame panel has a surface that defines an aperture or an opening 42 for each electronic device site on the base insulative layer. Each opening in the frame panel may be in a range of from about 0.2 millimeters (mm) to about 5 mm larger in the x and y dimensions than the electronic device.

The frame panel stabilizes the base insulative layer during fabrication of the interconnect structure, and also may increase the planarity of the unencapsulated surface of the base insulative layer during processing. The frame panel may be a relatively permanent component of the interconnect structure. As shown in FIG. 2(a), the frame panel may be large enough to comprise a plurality of apertures, wherein each aperture is for a different electronic device site on the base insulative layer, and whereby the frame panel provides stability and increased planarity to a plurality of electronic device sites. Alternatively, the frame panel may comprise a single aperture and be sized to provide stability and increased planarity to one electronic device site on the base insulative layer.

The first region and second region of the frame panel comprise different materials. The first region and second region of the frame panel differ in function, and the material selection for the regions is based on that proscribed function. In one embodiment, the first region is defined by a relatively high affinity or adhesability to the base insulative layer relative to the second region. The material selection for the first region, then, can be based on the adhesive, the base insulative layer, the method of adhesion, fabrication parameters, and the like. The second region has a relatively lower high affinity or adhesability to the base insulative layer than the first region. But, the second region has a relatively higher dimensional stability, or resistance to stress, temperature or humidity. The material selection for the second region can be based on process conditions, use conditions, and other considerations.

Further, the first region of the frame panel may include a material that facilitates bonding of the frame panel to the base insulative layer, as illustrated in FIG. 1. In one embodiment, the first region may be a polymeric material. Suitable inorganic materials may include a ceramic, a glass, an oxide or a nitride. Suitable polymeric materials may include a polyimide, an epoxy, an epoxy blend or a combination of two or more thereof. In one embodiment, the first region comprises a polymide. The polymeric material may include one or more reinforcing fillers. Such fillers may include fibers or small inorganic particles. Suitable fibers may be glass fibers or carbon fibers. Suitable particles may include silicon carbide, boron nitride, or aluminum nitride. In another embodiment, the first region may be an inorganic material. Additives and surface treatments (to both the frame panel and the base insulative layer) may be used to affect and control the adhesive interaction between the frame panel first region and the base insulative layer.

The second region of the frame panel comprises a material that, in one embodiment, may add strength and durability to the frame panel. The second region material may enable the frame panel to have a desirable coefficient of thermal expansion, rigidity, modulus, or thermal conductivity. Suitable materials in the second region may include metal or ceramic. In one embodiment, the second region comprises a metal selected from titanium, iron, copper, tin or a combination of two or more thereof. Alternatively, the metal may be an alloy or metal composite, such as stainless steel or Cu:Invar:Cu. In one embodiment, the second region comprises copper. The specific combination of materials the frame panel regions are formed from may be selected for a particular design based on the desired coefficient of thermal expansion, modulus, thermal conductivity, rigidity, surface adhesion, or other desired mechanical properties of the frame panel.

The frame panel may have a coefficient of thermal expansion (CTE) that is greater than about 3 ppm/° C. The frame panel may have a coefficient of thermal expansion (CTE) that is less than about 20 ppm/° C. In one embodiment, the frame panel may have a thickness equal or close to the thickness of the electronic device.

In one embodiment of the invention, the first region and the second region of the frame panel are each in the form of a layer, wherein the two layers are bonded together (see FIGS. 1 and 2(b)). If desired, the frame panel may be comprised of more than two layers. The additional layer(s) may be comprised of material that is similar or different than the material the first and second region layers are comprised of. In another embodiment, the second region is a layer and the first region is in the form of a partial or full coating over the layer. In another embodiment, the second region is a layer and the first region comprises a plurality of segments located on a surface of the second region. Alternatively, the first region may be comprised of a plurality of segments located within the second region layer, wherein the surface of one or more of the segments is exposed on the first surface of the frame panel. In another embodiment, the first region is in the form of a layer, and the second region comprises a plurality of segments located on or within the first region layer. In the two embodiments above, a surface of the first region segment is in contact with the base insulative layer to provide adhesion.

A surface of the first region may be exposed on the first surface of the frame panel so that the first region surface can bond to the base insulative layer. As noted above, the surface of the first region may be altered mechanically, chemically or physically to further enhance and improve its capacity for adhesion to the base insulative layer.

A suitable thickness of the frame panel may be selected with reference to the end-use application, the desired degree of rigidity, the number and type of electronic devices, and the like. The thickness may be greater than about 2 micrometers. The thickness of the frame panel may be less than about 50 micrometers. In one embodiment, the frame panel has a thickness in a range of from about 50 micrometers to about 100 micrometers, from about 100 micrometers to about 200 micrometers, from about 200 micrometers to about 400 micrometers, from about 400 micrometers to about 800 micrometers, or greater than about 800 micrometers.

If the first region and/or second region of the frame panel is in the form of a layer, the thickness of the first or second region layer may be greater than about 0.1 micrometers. The thickness may be less than about 100 micrometers. In one embodiment, the layer has a thickness in a range of from about 0.1 micrometers to about 1.0 micrometers, from about 1.0 micrometers to about 10 micrometers, from about 10 micrometers to about 100 micrometers, or greater than about 100 micrometers.

In one embodiment, there is an electrical connection between the electronic device and the base insulative layer, as shown in FIG. 1. Specifically, an electrical connection exists between the I/O contact(s) located on the electronic device and the electrical conductor(s) 44 located on the base insulative layer.

Referring to FIG. 1, suitable electrical conductors that may be located on the base insulative layer include pads, pins, bumps, and solder balls. The electrical connection between the base insulative layer and the electronic device may be a structure selected based on application specific parameters. For example, an electrically connective pathway may be formed from a solder ball. Additional examples of electrical connections include apertures, holes, or vias 46 which may pass through the base insulative layer and the adhesive layer to one or more I/O contacts on the electronic device. In one embodiment, the vias may be sized so that they are microvias. If desired, traces, power planes or ground planes may be located on the first surface of the base insulative layer.

Electrically conductive material, indicated by reference number 48, may be disposed in the vias extending to the I/O contacts on the electronic device and onto the first surface of the base insulative layer. The electrically conductive material may be a metal or an electrically conductive polymer. Examples of suitable electrically conductive materials may include an epoxy, polysulfone, or polyurethane that incorporates metal particle fillers. Suitable metal particles include silver and gold. Other suitable metals may include Al, Cu, Ni, Sn, and Ti. Rather than filled polymeric material, inherently conductive polymers may be used. Suitable conductive polymers include polyacetylene, polypyrrole, polythiophene, polyaniline, polyfluorene, poly-3-hexylthiophene, polynaphthalenes, poly-p-phenylene sulfide, and poly-p-phenylene vinylene. If viscosity and stability issues are addressed, the inherently conductive polymer may be filled with an electrically conductive filler to further enhance the electrical conductivity. If the electrically conductive material is metal, the electrically conductive material may be present in a metallization pattern on the first surface of the base insulative layer and on the exposed surface of the vias extending to the I/O contacts on the electronic device (see FIG. 1).

Interconnection to one or more complex electronic devices, including semiconductor chips such as microprocessors, video processors and ASICs (Application Specific Integrated Circuits), may require an additional interconnection layer to fully route out all of the required chip I/O contacts. For these electronic devices, one or more additional interconnect layers may exist over the first surface of the base insulative layer. For more simple electronic devices with less routing complexity, only one interconnect layer may be required.

Figure 3:
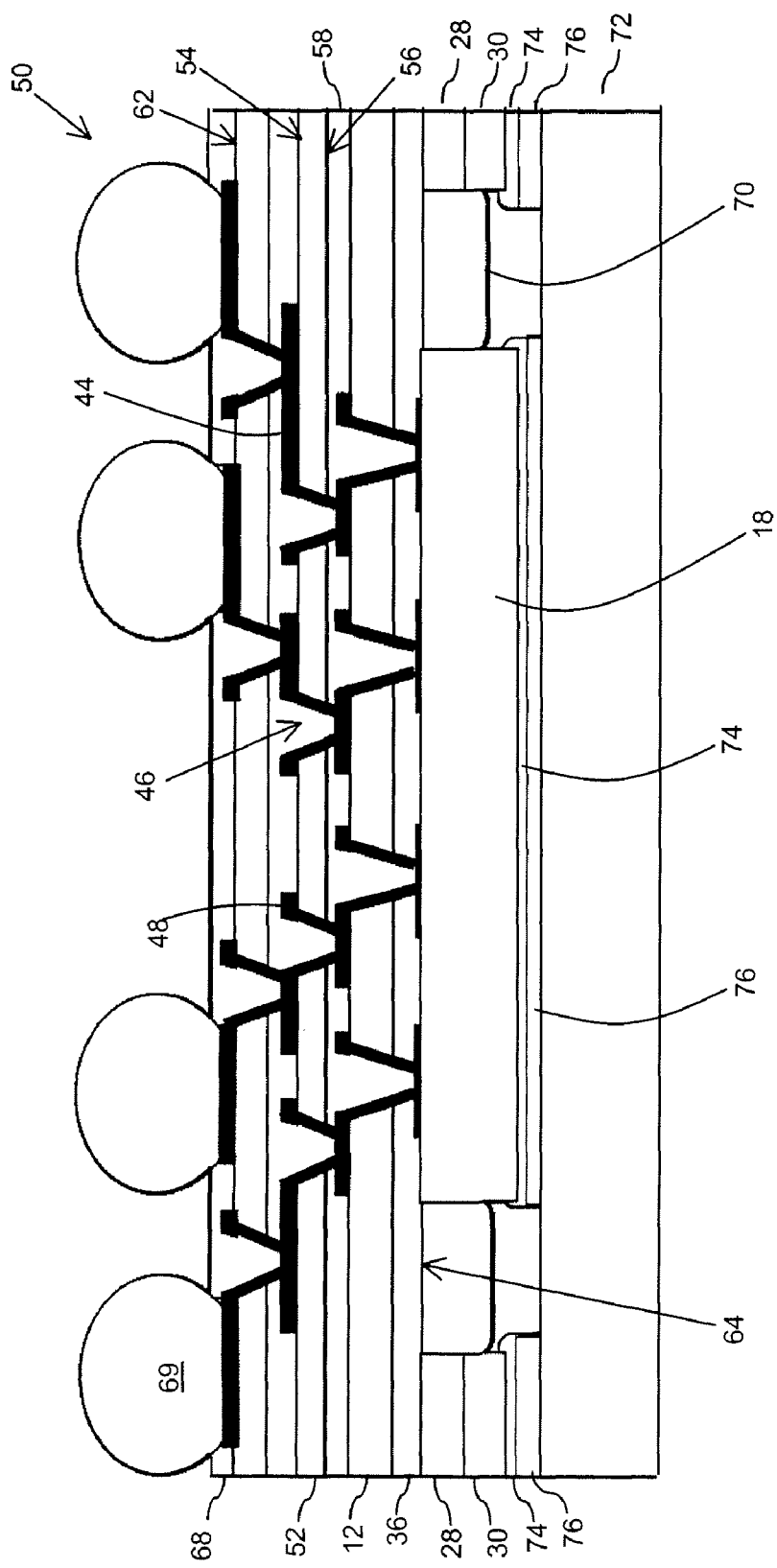
FIG. 3 is a cross-sectional side view of an interconnect assembly made in accordance with an alternative embodiment of the present invention.

Referring to FIG. 3, multiple interconnect layers cooperate to form an interconnect assembly 50. Each additional interconnection layer comprises an additional insulative layer 52, having a first surface 54 and a second surface 56. Each additional interconnect layer is bonded to a preceding interconnect layer via an adhesive layer 58. For example, an additional insulative layer 52 is bonded to the first surface of the base insulative layer. Suitable adhesives for use in the invention include those materials indicated as being suitable adhesive materials hereinabove.

Alternatively, the additional insulative layer 52 may be a self-bonding polymer that bonds directly to the top surface of the preceding interconnect layer. Suitable self-bonding polymers include epoxies. Additionally, the additional insulative layer may be a polymer applied in liquid form and cured in place, thus bonding directly to the preceding interconnect layer. Suitable materials for use as in the self-bonding additional insulative layer may include one or more of polyimide, polyetherimide, benzocyclobutene (BCB), liquid crystal polymer, bismaleimide-triazine resin (BT resin), epoxy, or silicone.

The electrical conductor(s) 44 on the additional insulative layer is electrically connected to the electrical conductor(s) on a preceding insulative layer. For example, vias may extend through an additional insulative layer and through the adhesive layer 58 to selected electrical conductors on the base insulative layer, as shown in FIG. 3. Electrically conductive material, as described above, may be disposed in the vias extending to the electrical conductors on the base insulative layer and onto the first surface of the additional insulative layer. In one embodiment, the electrically conductive material is present in a metallization pattern on the additional insulative layer, as described hereinabove for the first interconnect layer.

The interconnect assembly has a first surface 62 and a second surface 64. A dielectric or solder masking material 68 may be disposed on the first surface of the interconnect assembly to passivate any metal traces and to define contact pads used for assembly or package I/O contacts (see FIGS. 1 and 3). The package I/O contacts may have additional metal depositions such as Ti:Ni:Au applied to the exposed contact pads to provide more robust I/O contacts. The I/O contact pads can have pins, solder spheres, or leads attached to them or left as is creating a pad array. FIG. 3 depicts an interconnect assembly with an array of solder spheres 69 such as for a ball grid array. Other interconnect structures may also be used. For example, an interconnect assembly may have an array of pins such as for a pin grid array.

As illustrated in FIGS. 1 and 3, encapsulation material 70 may be disposed in the area surrounding the electronic device to protect the electronic device and the interconnect structure from moisture and thermo-mechanical stresses. The base insulative layer and exposed electronic device may be encapsulated with encapsulation material to fully embed the base insulative layer and the electronic device. In another embodiment, the base insulative layer and exposed electronic device may be partially encapsulated to embed the base insulative layer and portions of the electronic device.

Encapsulation materials that may be used include thermoplastic and thermoset polymers. Suitable aliphatic and aromatic polymers may include polyetherimides, acrylates, polyurethanes, polypropylene, polysulfone, polytetrafluoroethylenes, epoxies, benzocyclobutene (BCB), room temperature vulcanizable (RTV) silicones and urethanes, polyimides, polyetherimides, polycarbonates, silicones, and the like. In one embodiment, the encapsulation material is a thermoset polymer due to the relatively low cure temperatures available. The encapsulation material may include a filler material. The type, size and amount of the filler material may be used to tailor various molding material properties, such as thermal conductivity, thermal coefficient-of-expansion, viscosity and moisture uptake. For example, these materials may include particles, fibers, screens, mats, or plates of inorganic particles. Suitable filler materials may include glass, silica, ceramic, silicon carbide, alumina, aluminum nitride, boron nitride, gallium, or other metals, metal oxide, metal carbides, metal nitrides, or metal silicides. Other suitable filler materials may include carbon-based materials.

A gap or moat region may exist between the inner edges of each frame panel opening, and the outer edge of the electronic device disposed within the opening. This gap may either be left unfilled or may be fully or partially filled with encapsulation material. The gap between the inner edges of the frame panel opening, and the outer edge of the electronic device may be partially filled so that it is between about 10% full and about 90% full.

Referring to FIG. 3, a lid/thermal spreader 72 may be bonded to the second surface of the electronic device to provide thermal protection to the electronic device. The lid/thermal spreader is bonded with a thermal interface material (TIM) 74. The lid/thermal spreader may also be bonded to the second surface of the frame panel via an adhesive layer 76. Alternatively, the backside of the electronic device may be left exposed to facilitate heat removal during device operation for higher power devices with about 5 watts to about 100 watts or more dissipation.

The embodiments described herein are examples of compositions, structures and systems having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

What is claimed is:

1. An electronic component, comprising:
    a base insulative layer having a first surface and a second surface;
    at least one electronic device having a first surface and a second surface that is opposite from and parallel to the first surface, wherein the first surface of the electronic device is secured to the second surface of the base insulative layer;
    at least one I/O contact located on the first surface of the electronic device; and
    a frame panel defining an aperture, wherein the electronic device is disposed within the aperture, and the frame panel is a multi-functional structure comprising:
        a first region comprising a first material, wherein a surface of the first region secures to the base insulative layer; and
        a second region comprising a second material, wherein a surface of the second region secures to the first region without an intervening region there between;
        wherein the first material and the second material differ from each other and the first material has greater adhesive properties than the second material;
    wherein the frame panel is constructed such that the aperture extends entirely through the first and second regions and is further constructed such that the second surface of the electronic device is left exposed when placed within the aperture of the frame panel.

2. The electronic component of claim 1, wherein the first region comprises a polymeric material.

3. The electronic component of claim 1, wherein the first region comprises a ceramic, a glass, an oxide or a nitride.

4. The electronic component of claim 1, wherein the second region comprises a metal or an inorganic material.

5. The electronic component of claim 1, wherein the second region comprises an epoxy, a polyimide or other polymer.

6. The electronic component of claim 5, wherein the second region further comprises a filler.

7. The electronic component of claim 1, wherein the first region is a layer.

8. The electronic component of claim 7, wherein the first region layer has a thickness in a range of from about 5 micrometers to about 50 micrometers.

9. The electronic component of claim 7, wherein the second region comprises a plurality of segments located within or on top of the first region.

10. The electronic component of claim 1, wherein the second region is a layer.

11. The electronic component of claim 10, wherein the second region layer has a thickness in a range of from about 50 micrometers to about 1000 micrometers.

12. The electronic component of claim 10, wherein the first region comprises a plurality of segments located on, or partially within, the second region.

13. The electronic component of claim 10, wherein the first region is in the form of a partial coating or a full coating that is disposed on a surface of the second region.

14. The electronic component of claim 1, wherein the electronic device is secured to the second surface of the base insulative layer, and the electronic component further comprises:
   encapsulation material that fully embeds, or partially embeds, the second surface of the base insulative layer and the electronic device.

15. The electronic component as defined in claim 14, wherein the encapsulation material comprises a liquid crystal polymer, polyamide, polycarbonate, polyether imide, polypropylene, polysulfone, polyimide, polyurethane, epoxy, or silicone.

16. The electronic component as defined in claim 1, further comprising an electrical connection structure, which comprises:
   at least one via extending from the first surface of the base insulative layer to an I/O contact on the first surface of the electronic device; and
   electrically conductive material disposed within at least a portion of the via, the electrically conducting material extending through the via to the I/O contact on the electronic device.

17. The electronic component as defined in claim 16, further comprising electrically conductive traces, power planes or ground planes on the first surface of the base insulative layer.

18. An electronic component, comprising:
   a base insulative layer having a first surface and a second surface;
   an electronic device having a first surface and a second surface that is opposite from and parallel to the first surface, with the first surface of the electronic device being secured to the second surface of the base insulative layer;
   a first I/O contact located on the first surface of the electronic device; and
   a frame panel defining an aperture, wherein the electronic device is disposed within the aperture, and the frame panel is a multi-functional structure lacking any circuitry and having:
      a first region secured to the base insulative layer; and
      a second region secured directly to the first region, the second region having a lower affinity or adhesability to the base insulative layer than the first region, but a higher dimensional stability, or resistance to stress, temperature or humidity, than the first region;
   wherein the frame panel is constructed such that the aperture extends entirely through the first and second regions and is further constructed such that the second surface of the electronic device is left exposed when placed within the aperture of the frame panel.

19. The electronic component as defined in claim 18, further comprising a second I/O contact in communication with the first I/O contact, and the second I/O contact is disposed on the frame panel.

20. The electronic component of claim 1 wherein the second material has a higher dimensional stability, or resistance to stress, temperature or humidity, than the first material.

21. The electronic component of claim 1 wherein the first material comprises:
   a polymeric material configured to facilitate bonding of the first region to the base insulative layer, the polymeric material having greater adhesive properties than the second material; and
   at least one reinforcing filler material to provide dimensional stability to the first region.

22. The electronic component of claim 21 wherein the at least one reinforcing filler material comprises at least one of glass fibers, carbon fibers, silicon carbide, boron nitride, and aluminum nitride.

23. An electronic component, comprising:
   a base insulative layer;
   an electronic device having a front surface secured to the base insulative layer and a back surface that is opposite from the front surface; and
   a frame panel defining an aperture, wherein the electronic device is disposed within the aperture, and the frame panel comprises:
      a first layer secured to the base insulative layer, the first layer comprising an adhesive material configured to bond the first layer to the base insulative layer and a filler material to provide dimensional stability to the first layer; and
      a second layer secured directly to the first layer without an intervening layer therebetween, the second layer having a lower adhesability than the first layer, but a higher dimensional stability, or resistance to stress, temperature or humidity, than the first layer;
   wherein the frame panel is constructed such that the aperture extends entirely through the first and second layers, such that the back surface of the electronic device is left exposed.

24. The electronic component of claim 1 further comprising a thermal spreader attached to the second surface of the electronic device and to the second region on a surface opposite from the first region.

* * * * *